US008576001B2

United States Patent
Pyo et al.

(10) Patent No.: US 8,576,001 B2
(45) Date of Patent: Nov. 5, 2013

(54) OFFSET COMPENSATION APPARATUS FOR MAGNETIC DETECTION CIRCUIT AND METHOD THEREOF

(75) Inventors: Seung Chul Pyo, Gyunggi-do (KR); Kyung Uk Kim, Gyunggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 51 days.

(21) Appl. No.: 13/426,089

(22) Filed: Mar. 21, 2012

(65) Prior Publication Data
US 2012/0274381 A1 Nov. 1, 2012

(30) Foreign Application Priority Data
Apr. 27, 2011 (KR) .................. 10-2011-0039778

(51) Int. Cl.
*H03F 15/00* (2006.01)

(52) U.S. Cl.
USPC .................................. 330/6; 330/9

(58) Field of Classification Search
USPC ............................................ 330/6, 9, 69, 252
See application file for complete search history.

(56) References Cited

U.S. PATENT DOCUMENTS

| 3,244,876 A * | 4/1966 | Morito et al. ................. 250/281 |
| 8,126,663 B2 * | 2/2012 | Brown et al. .................. 702/57 |
| 2004/0172148 A1 * | 9/2004 | Horibe ............................ 700/94 |
| 2010/0188275 A1 * | 7/2010 | Kaihara et al. ............... 341/132 |
| 2013/0002242 A1 * | 1/2013 | Tsukamoto et al. ..... 324/207.12 |

* cited by examiner

*Primary Examiner* — Henry Choe
(74) *Attorney, Agent, or Firm* — Ladas & Parry, LLP

(57) ABSTRACT

Disclosed herein are an offset compensation apparatus for a magnetic detection circuit, and a method thereof. The offset compensation apparatus includes: an amplifying unit amplifying an output voltage, and outputting the amplified voltages; an offset detection unit detecting an offset; a comparison unit determining whether or not the offset output from the offset detection unit is greater than a pre-set positive reference value or smaller than a pre-set negative reference value; a counter unit; and a current supply.

11 Claims, 5 Drawing Sheets

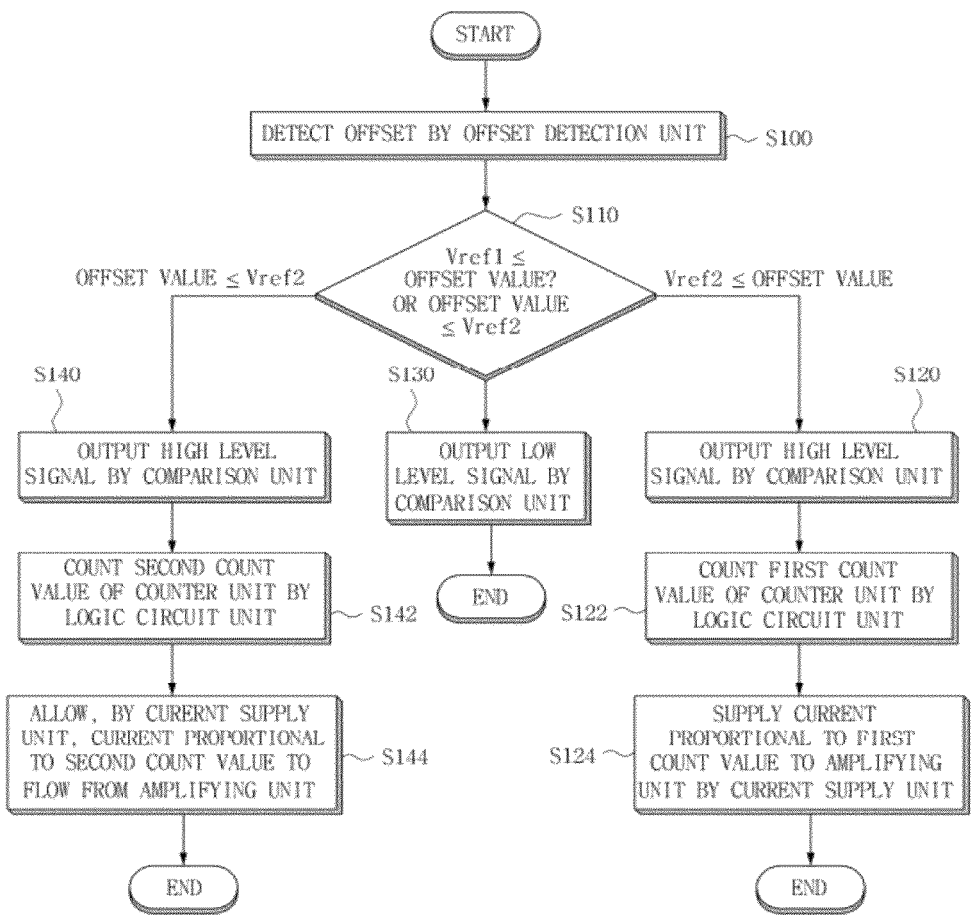

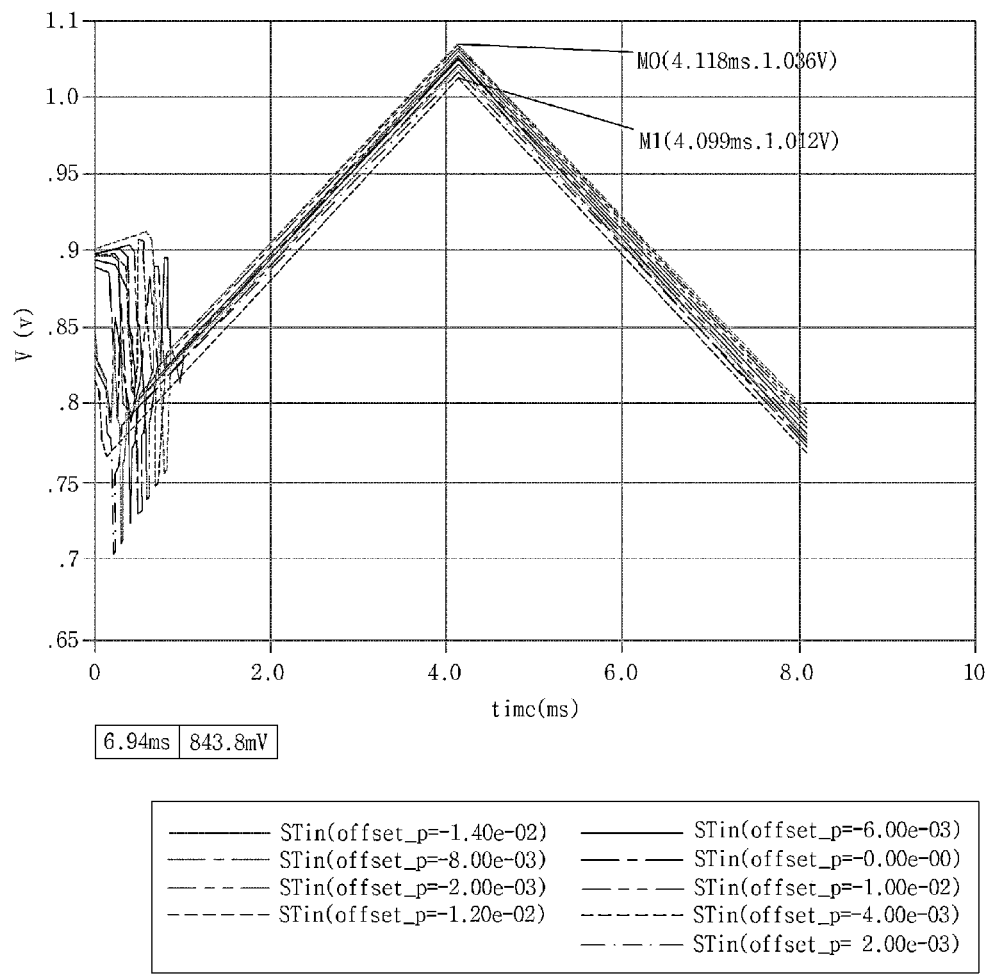

OFFSET COMPENSATION APPARATUS FOR MAGNETIC DETECTION CIRCUIT AND METHOD THEREOF

CROSS REFERENCE TO RELATED APPLICATION

This application claims the benefit of Korean Patent Application No. 10-2011-0039778, filed on Apr. 27, 2011, entitled "Offset Compensation Apparatus for The Magnetic Detection Circuit and Method Thereof", which is hereby incorporated by reference in its entirety into this application.

BACKGROUND OF THE INVENTION

1. Technical Field

The present invention relates to an offset compensation apparatus for a magnetic detection circuit and a method thereof.

2. Description of the Related Art

In a magnetic detection circuit using a Hall element, when a current is applied between any pair of counter electrodes among electrodes formed at four corners of the Hall element and a magnet is let to approach, a potential difference is made between the other remaining counter electrodes to which a current is not applied, thereby detecting magnetism.

However, the majority of Hall elements are fabricated to be non-uniform, so, although a magnet is not let to approach, a potential difference is made between the other remaining counter electrodes to which a current is not applied, resulting in that magnetism is erroneously detected as if there was a magnet nearby.

A magnetic charge detected although a magnet is not let to approach is called a magnetic offset, and an offset compensation apparatus of a magnetic detection circuit is employed to compensate for such a magnetic offset.

The prior art offset compensation apparatus of a magnetic detection circuit is configured to amplify a magnetic offset through an amplifying unit by using a spinning current scheme, sample the amplified magnetic offset through a sample hold circuit unit and hole it, and then, cancel (or remove) an offset through an adding unit.

However, in the prior art, since the magnetic offset is amplified through the amplifying unit, the offset can be canceled only within a range in which the offset is not saturated through a gain of the amplifying unit, causing a problem in which an operating point is distorted at a region beyond (or outside) the range.

SUMMARY OF THE INVENTION

The present invention has been made in an effort to provide an offset compensation apparatus of a magnetic detection circuit and a method thereof capable of detecting an offset of an amplifying unit in real time and reflecting the detected offset in an input of the amplifying unit to thereby compensate for a distortion phenomenon of an output due to the offset amplified by the amplifying unit.

According to a first preferred embodiment of the present invention, there is provided an offset compensation apparatus for a magnetic detection circuit, including: an amplifying unit amplifying an output voltage in a first detection state output from a Hall element and an output voltage in a second detection state output from the Hall element, and outputting the amplified voltages; an offset detection unit receiving the output voltage in the first detection state and the output voltage in the second detection state output from the amplifying unit, detecting an offset, and outputting the detected offset; a comparison unit determining whether or not the offset output from the offset detection unit is greater than a pre-set positive reference value or smaller than a pre-set negative reference value, and outputting a determination result; a counter unit increasing a first count value by 1 at a time when the offset is greater than the pre-set positive reference value and increasing a second count value by 1 at a time when the offset is smaller than the pre-set negative reference value based on the determination result output from the comparison unit; and a current supply unit providing a current proportional to the first count value from the counter unit to the amplifying unit to reduce an output voltage, and allowing a current proportional to the second count value from the counter unit to flow from the amplifying unit to increase the output voltage.

The offset detection unit may include: a first switch connected to an output terminal of the amplifying unit; a first capacitor positioned between the first switch and a ground; a second switch positioned between the first capacitor and the comparison unit; a third switch connected to the output terminal of the amplifying unit; a second capacitor positioned between the third switch and a ground; and a fourth switch positioned between the second capacitor and the comparison unit, wherein, in the first detection state, the first switch is turned on and the second and third switches are turned off to store a first detection state value as an accumulated quantity of electric charges in the first capacitor, and in the second detection state, the first and fourth switches are turned off and the second switch is turned on to store a second detection state value as an accumulated quantity of electric charges in the second capacitor, and then, the accumulated quantity of electric charges of the first capacitor and that of the second capacitor are averaged to detect an offset.

The comparison unit may include: a first comparator determining whether or not the offset output from the offset detection unit is greater than the pre-set positive reference value; and a second comparator determining whether or not the offset output from the offset detection unit is smaller than the pre-set negative reference value.

The counter unit may include: a first counter increasing the first count value by 1 at a time when the offset is greater than the pre-set positive reference value according to the determination result output from the comparison unit; and a second counter increasing the second count value by 1 at a time when the offset is smaller than the pre-set negative reference value according to the determination result output from the comparison unit.

The current supply unit may include: a first digital-to-analog converter (DAC) providing a current proportional to the first count value to the amplifying unit so that an output value obtained by subtracting the provided current value in proportion thereto is output; and a second DAC allowing a current proportional to the second count value to flow from the amplifying unit so that a value obtained by adding the outflow (or discharged) current value in proportion thereto is output.

The offset compensation apparatus may further include: a sample hold circuit unit sampling and holding the output voltage in the first detection state and the output voltage in the second detection state output from the amplifying unit; an adding unit receiving the output voltage in the first detection state and the output voltage in the second detection state which have been sampled and held by the sample hold circuit unit, and outputting a Hall voltage from which an offset voltage was canceled; and a Schmitt trigger comparing an output voltage output from an output terminal of the adding unit with a pre-set voltage value to determine whether or not the former is greater than the latter, and outputting a corresponding determination value.

According to a second preferred embodiment of the present invention, there is provided an offset compensation method for a magnetic detection circuit, including: step (A) of receiving, by an offset detection unit, an output voltage in a first detection state and an output voltage in a second detection state output from an amplifying unit, detecting an offset, and outputting the detected offset; step (B) of determining, by a comparison unit, whether or not the offset output from the offset detection unit is greater than a pre-set positive reference value or smaller than a pre-set negative reference value; step (C) of increasing, by a counter unit, a first count value by 1 at a time when the offset is greater than the pre-set positive reference value and increasing a second count value by 1 at a time when the offset is smaller than the pre-set negative reference value based on the determination result output from the comparison unit; and step (D) of providing, by a current supply unit, a current proportional to the first count value from the counter unit to the amplifying unit to reduce an output voltage, and allowing a current proportional to the second count value from the counter unit to flow from the amplifying unit to increase the output voltage.

Step (A) may include: step (A-1) of storing the first detection state value as an accumulated quantity of electric charges in a first capacitor provided in the offset detection unit in the first detection state; step (A-2) of storing the second detection state value as an accumulated quantity of electric charges in a second capacitor provided in the offset detection unit; and step (A-3) of averaging the accumulated quantity of electric charges of the first capacitor and that of the second capacitor to detect an offset.

Step (B) may include: step (B-1) of determining, by a first comparator provided in the comparison unit, whether or not the offset output from the offset detection unit is greater than the pre-set positive reference value; and step (B-2) of determining, by a second comparator provided in the comparison unit, whether or not the offset output from the offset detection unit is smaller than the pre-set negative reference value.

Step (C) may include: step (C-1) of increasing, by a first counter provided in the counter unit, the first count value by 1 at a time when the offset is greater than the pre-set positive reference value according to the determination result output from the comparison unit; and step (C-2) of increasing, by a second counter provided in the counter unit, the second count value by 1 at a time when the offset is smaller than the pre-set negative reference value according to the determination result output from the comparison unit.

Step (D) may include: step (D-1) of providing, by a first digital-to-analog converter (DAC) provided in the current supply unit, a current proportional to the first count value to an amplifying unit so that an output value obtained by subtracting the provided current value in proportion thereto is output; and step (D-2) of allowing, by a second DAC provided in the current supply unit, a current proportional to the second count value to flow from the amplifying unit so that a value obtained by adding the outflow current value in proportion thereto is output.

BRIEF DESCRIPTION OF THE DRAWINGS

FIG. 4 is a flow chart illustrating an offset compensation method of the magnetic detection circuit according to the first embodiment of the present invention; and FIG. 5 is a graph showing output values when an offset is arbitrarily applied to the offset compensation apparatus of the magnetic detection circuit according to the first embodiment of the present invention.

DESCRIPTION OF THE PREFERRED EMBODIMENTS

Figure 1:
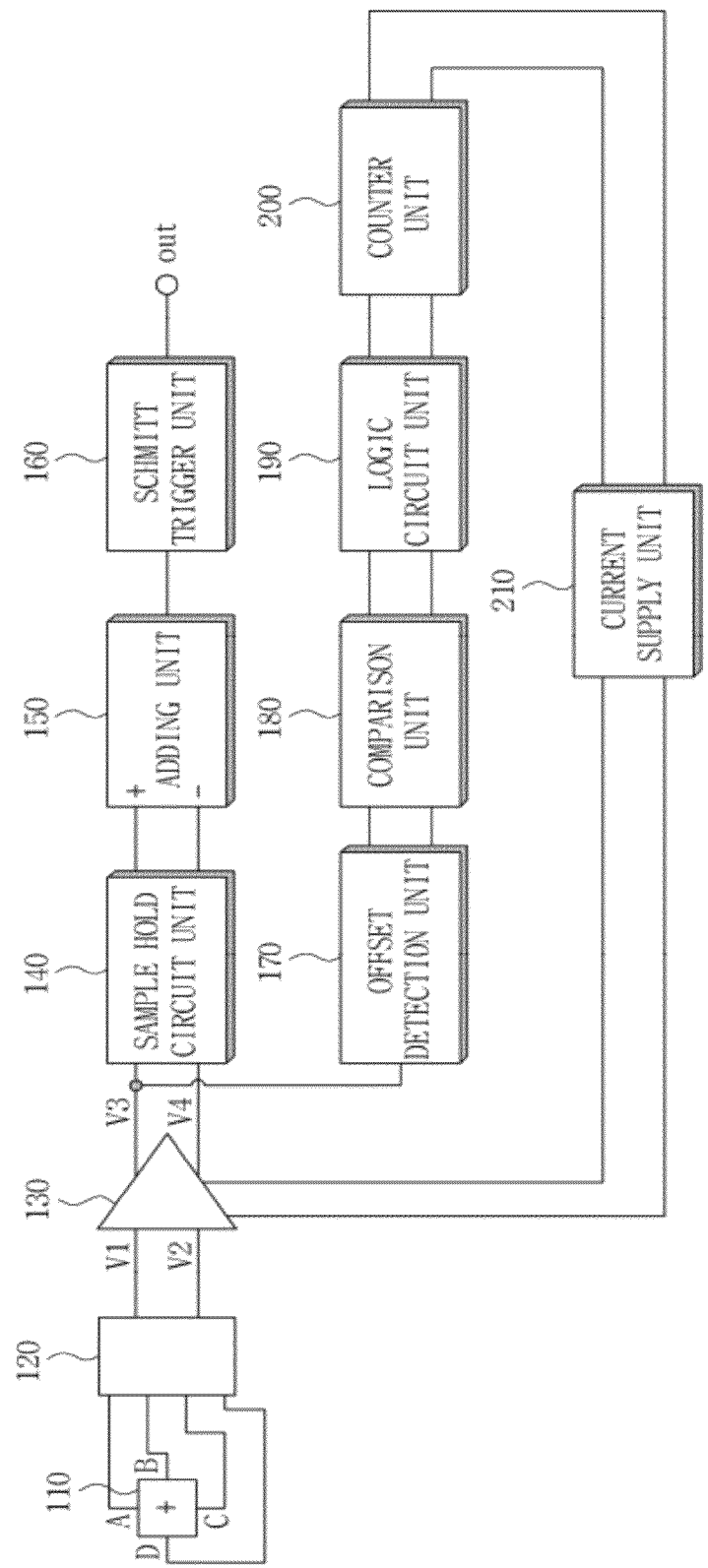
FIG. 1 is a schematic block diagram of an offset compensation apparatus of a magnetic detection circuit according to a first embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. In describing the present invention, a detailed description of related known functions or configurations will be omitted so as not to obscure the gist of the present invention.

Hereinafter, preferred embodiments of the present invention will be described in detail with reference to the accompanying drawings.

FIG. 1 is a schematic block diagram of an offset compensation apparatus of a magnetic detection circuit according to a first embodiment of the present invention.

With reference to FIG. 1, a Hall element offset compensation apparatus according to the first embodiment of the present invention includes a Hall element 110, a switch unit 120, an amplifying unit 130, a sample hole circuit unit 140, an adding unit 150, a Schmitt trigger unit 160, an offset detection unit 170, a comparison unit 180, a logic circuit unit 190, a counter unit 200, and a current supply unit 210.

The Hall element 110 is a magneto-electric transducer having a first pair of terminals A-C and a second pair of terminals B-D.

The switch unit 120 includes four input terminals connected to the respective terminals A, B, C, and D of the Hall element 110 and first and second output terminals. The switch unit 120 supports a function of switching (or changing) a first detection state in which a power source voltage is input to the first pair of terminals A-C of the Hall element 110 and a detection voltage is output from the second pair of terminals B-D and a second detection state in which a power source voltage is input to the second pair of terminals B-D and a detection voltage is output from the first pair of terminals A-C.

The amplifying unit 130 includes first and second input terminals to which the first and second output terminals of the switch unit 120 are connected, respectively, and first and second output terminals.

Figure 2:
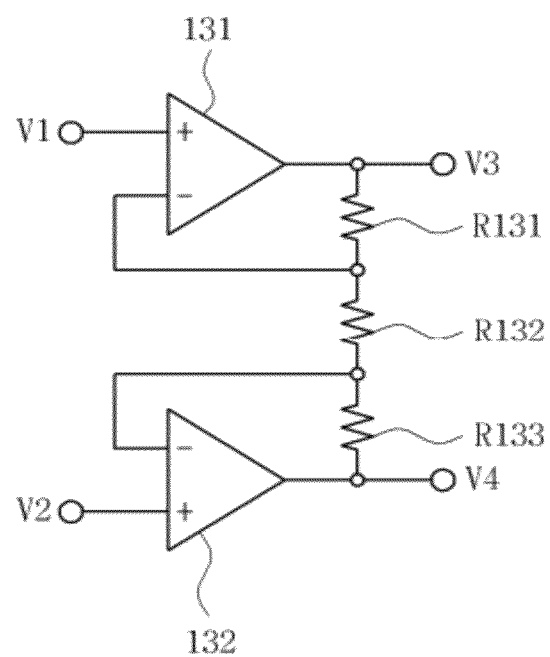
FIG. 2 is a view showing a detailed configuration of an amplifying unit of FIG. 1.

The amplifying unit 130 has an instrumentation amplifier configuration as shown in FIG. 2. The amplifying unit 130 includes differential amplifiers 131 and 132 and resistors R131, R132, and R133.

The differential amplifiers 131 and 132 serve as non-inverting amplifiers, respectively. The first input terminal of the amplifying unit 130 is connected to a non-inverting input terminal of the first differential amplifier 131, the second input terminal of the amplifying unit 130 is connected to a non-inverting input terminal of the second differential amplifier 132, the first output terminal of the amplifying unit 130 is connected to an output terminal of the first differential amplifier 131, and the second output terminal of the amplifying unit 130 is connected to an output terminal of the second differential amplifier 132.

Since the amplifying unit 130 has such an instrumentation amplifier configuration, influence of common-mode noise in a differential input can be suppressed. Here, it is assumed that the differential amplifiers 131 and 132 are set to have identical amplification factor.

The sample hold circuit unit 140 has first and second input terminals to which the first and second output terminals of the amplifying unit 130 are connected, respectively, and first and second output terminals.

The first output terminal of the sample hold circuit unit 140 is input to a non-inverting input terminal of the adding unit 150, and the second output terminal of the sample hold circuit unit 140 is input to an inverting input terminal of the adding unit 150.

The sample hole circuit unit 140 samples and holds an output voltage V3 output from the amplifying unit 130 and provides the same to the non-inverting input terminal of the adding unit 150, and samples and holds an output voltage V4 output from the amplifying unit 130 and provides the same to the inverting input terminal of the adding unit 150.

The non-inverting input terminal of the adding unit 150 is connected to the first output terminal of the sample hold circuit unit 140, and the inverting input terminal of the adding unit 150 is connected to the second output terminal of the sample hold circuit unit 140.

The adding unit 150 receives the output voltage V3 of the amplifying unit 130, which has been sampled and held by the sample hold circuit unit 140, through the non-inverting input terminal thereof, receives the output voltage V4 of the amplifying unit 130, which has been sampled and held by the sample hold circuit unit 140, through the inverting input terminal thereof, cancels an offset voltage, and outputs a Hall voltage.

The Schmitt trigger unit 160 compares an output voltage output from the output terminal of the adding unit 150 with a pre-set voltage value to determine whether or not the former is greater than the latter, and outputs a corresponding determination value.

The offset detection unit 170 receives first and second state detection values output from the first output terminal of the amplifying unit 130, averages them to detect an offset, and outputs the offset.

The comparison unit 180 determines whether the offset value detected by the offset detection unit 170 is greater than a pre-set positive reference value or smaller than a pre-set negative reference value. When the offset value detected by the offset detection unit 170 is greater than a pre-set positive reference value or smaller than a pre-set negative reference value, the comparison unit 180 outputs a high level signal.

The logic circuit unit 190 receives an output value from the comparison unit 180, and when the offset value is greater than the pre-set positive reference value, the logic circuit unit 190 counts a first count value such that it is increased by 1 at a time, and when the offset value is smaller than the pre-set negative reference value, the logic circuit unit 190 counts a second count value such that it is increased by 1 at a time.

The counter unit 200 counts a first count value or a second count value according to an input signal from the logic circuit unit 190.

The current supply unit 210 provides a current proportional to the first count value to the inverting terminal of the first differential amplifier 131 of the amplifying unit 130 so that a value obtained by subtracting the provided current value in proportion thereto is output from the first differential amplifier 131.

Also, the current supply unit 210 allows a current proportional to the second count value to flow from the second differential amplifier 132 of the amplifying unit 130 so that a value obtained by adding the outflow (or discharged) current value in proportion thereto is output from the second differential amplifier 132.

The operation of the offset compensation apparatus of a magnetic detection circuit according to the first embodiment of the present invention will be described as follows.

The Hall element 110 is formed to have a geometrically equivalent shape with respect to the terminals A-C and B-D. As for the output voltage V1 generated between the terminals B-D when a voltage Vdd is applied between the terminals A-C of the Hall element 110 and the output voltage V2 generated between the terminals A-C when the voltage Vdd is applied between the terminals B-D, a Hall voltage Vh, an effective signal component, according to the strength of a magnetic field has an anti-phase (or reverse phase) and an offset voltage Vof of the Hall element 110 itself has an in-phase (or common phase).

Thus, these two output voltages from the Hall element 110 are amplified by the amplifying unit 130 and sampled and held through the sample hold circuit unit 140, and then, the output voltage V3 is applied to the non-inverting terminal of the adding unit 150 and the output voltage V4 is applied to the inverting terminal of the adding unit 150 to exclude an offset voltage and average the Hall voltages, thereby obtaining a Hall voltage without an offset voltage from the Hall element 110.

Thereafter, when Hall voltage output from the adding unit 150 is greater than a pre-set value, the Schmitt trigger unit 160 output a high level signal, and when the Hall voltage is smaller than the pre-set value, the Schmitt trigger unit 160 outputs a low level signal to thus provide information regarding the amplitude of the Hall voltage.

The offset detection unit 170 averages the first and second detection state values output from the first output terminal of the amplifying unit 130, detects an offset, and outputs the same. This will be described in more detail as follows.

First, as for the first detection state value V3 output from the first output terminal of the amplifying unit 130, in case in which an in-phase voltage is Vcc (=Vdd/2), the Hall voltage is Vh, and the offset is Vof, when a gain is A, $V3 = Vcc + AVh/2 + AVof/2$.

Thereafter, as for the second detection state value V3 output from the first output terminal of the amplifying unit 130, the first detection state value and the Hall voltage have the anti-phase and the offset has an in-phase, so $V3 = Vcc - AVh/2 + AVof/2$.

Thus, the offset detection unit 170 averages the first detection state value ($V3 = Vcc + AVh/2 + AVof/2$) and the second detection state value ($V3 = Vcc - AVh/2 + AVof/2$) output from the first output terminal to detect an offset (which is Vcc+ AVof/2 including the in-phase voltage Vcc in actuality), and outputs the same.

The comparison unit 180 determines whether or not the offset from the offset detection unit 170 is greater than a pre-set positive reference value. When the offset is greater than the pre-set positive reference value, the comparison unit 180 outputs a high level signal, and when the offset is smaller than the pre-set positive reference value, the comparison unit 180 outputs a low level signal.

Also, the comparison unit 180 determines whether or not the offset from the offset detection unit 170 is smaller than a pre-set negative reference value. When the offset is smaller than the pre-set negative reference value, the comparison unit 180 outputs a high level signal, and when the offset is greater than the pre-set negative reference value, the comparison unit 180 outputs a low level signal.

Then, the logic circuit unit 190 receives an output value from the comparison unit 180, and when the offset is greater than the pre-set positive reference value, the logic circuit unit 190 counts a first count value such that it is increased by 1 at a time, and when the offset is smaller than the pre-set negative reference value, the logic circuit unit 190 counts a second count value such that it is increased by 1 at a time.

Accordingly, the current supply unit 210 provides a current proportional to the size of the first count value to the inverting terminal of the first differential amplifier 131 of the amplifying unit 130, so that a value obtained by subtracting the supplied current value in proportion thereto can be output from the first differential amplifier 131.

Also, the current supply unit 210 allows a current proportional to the size of the second count value to flow from the second differential amplifier 132 of the amplifying unit 130, so that a value obtained by subtracting the outflow current value is output from the second differential amplifier 132.

In this manner, according to an embodiment of the present invention, the offset of the amplifying unit 130 is detected in real time and reflected in the input of the amplifying unit 130 to thus compensate for a distortion phenomenon of the output due to the offset amplified by the amplifying unit 130.

Also, according to an embodiment of the present invention, although a large offset is generated in the Hall element 110, it can be canceled by increasing or decreasing the input current of the amplifying unit 130.

Also, according to an embodiment of the present invention, the offset can be canceled while the Hall voltage is detected, without the necessity of having a period for canceling the offset like the auto-zero scheme, the offset compensation apparatus can be applicable to a linear Hall IC structure, as well as to a switch Hall IC structure.

Figure 3:
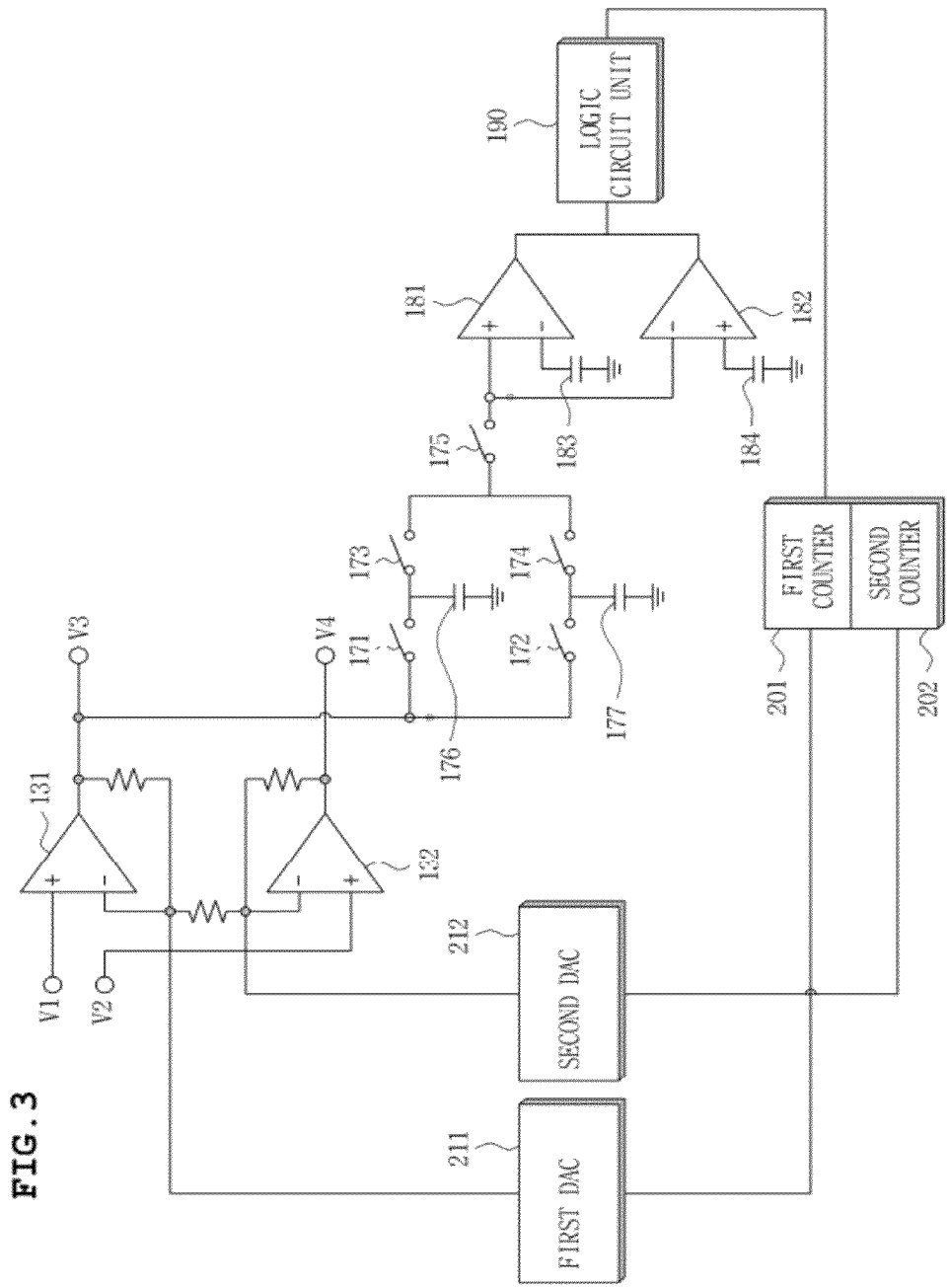
FIG. 3 is a view showing a detailed configuration of an offset detection unit, a comparison unit, a logic circuit unit, a counter unit, and a current supply unit of FIG. 1.

FIG. 3 is a view showing a detailed configuration of the offset detection unit, the comparison unit, the logic circuit unit, the counter unit, and the current supply unit of FIG. 1.

With reference to FIG. 3, the offset detection unit 170 of FIG. 1 includes switches 171 to 175 and capacitors 176 and 177. The comparison unit 180 includes a first comparator 181 and a second comparator 182. The counter unit 200 includes a first counter 201 and a second counter 202. The current supply unit 210 includes a first digital-to-analog converter (DAC) 211 and a second DAC 212.

The first output terminal of the offset detection unit 170 is connected to the non-inverting input terminal of the first comparator 181, and the second output terminal of the offset detection unit 170 is connected to the inverting input terminal of the second comparator 182.

A voltage source 183 for providing a positive reference voltage is connected to an inverting terminal of the first comparator 181, and a voltage source 184 for providing a negative reference voltage is connected to a non-inverting terminal of the second comparator 182.

In this configuration, in the first detection state, the switch 171 of the offset detection unit 170 is turned on and the switches 172 and 175 of the offset detection unit 170 are turned off, and in the second detection state, the switches 171 and 175 of the offset detection unit 170 are turned off and the switch 172 of the offset detection unit 170 is turned on.

Thus, the foregoing first and second detection state values amplified by the amplifying unit 130 are stored as accumulated quantity of electric charges equivalent to the size of the capacitors 176 and 177, storage circuits, respectively.

Thereafter, when the switches 173 and 174 are turned on, the quantity of electric charges accumulated in the capacitors 176 and 177 is averaged to detect an offset, and when the switch 175 is turned on, the detected offset is provided to the non-inverting input terminal of the first comparator 181 through the first output terminal and to the inverting input terminal of the second comparator 182 through the second output terminal.

Then, when the offset value output from the offset detection unit 170 is higher than a positive reference voltage, the first comparator 181 outputs a high level signal, and when the offset value output from the offset detection unit 170 is lower than the positive reference voltage, the first comparator 181 outputs a low level signal.

Also, when the offset value output from the offset detection unit 170 is lower than a negative reference voltage, the second comparator 182 outputs a high level signal, and when the offset value output from the offset detection unit 170 is higher than the negative reference voltage, the second comparator 182 outputs a low level signal.

Meanwhile, when the first comparator 181 of the comparison unit 180 outputs the high level signal, the logic circuit unit 190 increases the first count value of the first counter 201.

Also, when the second comparator 182 of the comparison unit 180 outputs the high level signal, the logic circuit unit 190 increases the second count value of the second counter 202.

The first DAC 211 of the current supply unit 210 provides a current proportional to the first count value to the inverting terminal of the first differential amplifier 131 of the amplifying unit 130, so that a value obtained by subtracting the provided current value in proportion thereto is output from the first differential amplifier 131.

Also, the second DAC 212 of the current supply unit 210 provides a current proportional to the second count value to the second differential amplifier 132 of the amplifying unit 130, so that a value obtained by adding the provided current value in proportion thereto is output from the second differential amplifier 132.

According to an embodiment of the present invention, the offset of the amplifying unit 130 is detected in real time and reflected in the input of the amplifying unit 130 to thus compensate for a distortion phenomenon of the output due to the offset amplified by the amplifying unit 130.

Also, according to an embodiment of the present invention, although a large offset is generated in the Hall element 110, it can be canceled by increasing or decreasing the input current of the amplifying unit 130.

Also, according to an embodiment of the present invention, the offset can be canceled while the Hall voltage is detected, without the necessity of having a period for canceling the offset like the auto-zero scheme, the offset compensation apparatus can be applicable to a linear Hall IC structure, as well as to a switch Hall IC structure.

FIG. 4 is a flow chart illustrating an offset compensation method of the magnetic detection circuit according to the first embodiment of the present invention.

With reference to FIG. 4, in an offset compensation method of a magnetic detection circuit according to the first embodiment of the present invention, first, the offset detection unit averages the first and second detection state values output from the first output terminal of the amplifying unit to detect an offset, and outputs the same (S100).

In particular, the offset detection unit, including the first and second capacitors, stores the first detection state value as an accumulated quantity of electric charges in the first capacitor in the first detection state and the second detection state value as an accumulated quantity of electric charges in the second capacitor, and then, averages the accumulated quantity of electric charges of the first capacitor and that of the second capacitor to detect an offset.

Next, the comparison unit determines whether or not the offset detected by the offset detection unit is greater than a pre-set positive reference value Vref1 (S110). When the offset detected by the offset detection unit is greater than a pre-set positive reference value Vref1, the comparison unit outputs a high level signal (S120), and when the offset detected by the offset detection unit is smaller than the pre-set positive reference value Vref1, the comparison unit outputs a low level signal (S130).

Namely, by using the first comparator provided in the comparison unit, the comparison unit determines whether or not the offset output from the offset detection unit is greater than the pre-set positive reference value, and when the offset output from the offset detection unit is greater than the pre-set positive reference value, the comparison unit outputs a high level signal, and when the offset output from the offset detection unit is smaller than the pre-set positive reference value, the comparison unit outputs a low level signal.

Also, the comparison unit determines whether or not the offset output from the offset detection unit is smaller than the pre-set negative reference value (S110), and when the offset output from the offset detection unit is smaller than the pre-set negative reference value, the comparison unit outputs a high level signal (S140), and when the offset output from the offset detection unit is greater than the pre-set negative reference value, the comparison unit outputs a low level signal (S142).

Namely, by using the second comparator provided in the comparison unit, the comparison unit determines whether or not the offset output from the offset detection unit is smaller than the pre-set negative reference value (S110), and when the offset output from the offset detection unit is smaller than the pre-set negative reference value, the comparison unit outputs a high level signal, and when the offset output from the offset detection unit is greater than the pre-set negative reference value, the comparison unit outputs a low level signal.

Then, the logic circuit unit receives the output value from the comparison unit, and when the offset is greater than the pre-set positive reference value, the logic circuit unit counts the first count value of the first counter of the counter unit such that it is increased by 1 at a time (S122), and when the offset is smaller than the pre-set negative reference value, the logic circuit unit counts the second count value of the second counter of the counter unit such that it is increased by 1 at a time (S142).

Accordingly, the current supply unit provides a current proportional to the size of the first count value to the inverting terminal of the first differential amplifier of the amplifying unit, so that an output value obtained by subtracting the supplied current value can be output from the first differential amplifier (S124).

In particular, the current supply unit, by using the first DAC, provides a current proportional to the first count value to the amplifying unit, so that a value obtained by subtracting the provided current value in proportion thereto is output.

Also, the current supply unit allows a current proportional to the size of the second count value to flow from the second differential amplifier of the amplifying unit, so that an output value obtained by subtracting the outflow current value is output from the second differential amplifier (S144).

In particular, the current supply unit, by using the second DAC, allows a current proportional to the second count value to flow from the amplifying unit, so that a value obtained by adding the outflow current value in proportion thereto is output from the amplifying unit.

In this manner, according to the method of the present embodiment, the offset of the amplifying unit 130 is detected in real time and reflected in the input of the amplifying unit 130, thereby compensating for a distortion phenomenon of the output due to the offset amplified by the amplifying unit.

FIG. 5 is a graph showing output values when an offset is arbitrarily applied to the offset compensation apparatus of a magnetic detection circuit according to the first embodiment of the present invention.

When the offset ranging from −14 mV to 14 mV is arbitrarily applied to the offset compensation apparatus of a magnetic detection circuit, while a magnetic field transitions to the range of −60 G to 60 G, an output value from the previous stage of the Schmitt trigger has a residual offset of about 20 mV according to offsets.

When the offset is desired to be canceled more precisely, it can be canceled by additionally installing more comparators and adjusting the amount of control current.

According to the preferred embodiment of the present invention, the offset of the amplifying unit is detected in real time and reflected in the input of the amplifying unit, thus compensating for a distortion phenomenon of the output due to the offset amplified by the amplifying unit.

Also, according to the preferred embodiment of the present invention, although a large offset is generated in the Hall element, it can be canceled by increasing the input current (or voltage) of the amplifying unit.

Also, according to the preferred embodiment of the present invention, since the offset is canceled while the Hall voltage is being detected, without the necessity of having a period for canceling the offset like an auto-zero scheme, the offset compensation apparatus of a magnetic detection circuit can also be applicable to a linear Hall IC structure, as well as to a switch Hall IC structure.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. An offset compensation apparatus for a magnetic detection circuit, the apparatus comprising:

an amplifying unit amplifying an output voltage in a first detection state output from a Hall element and an output voltage in a second detection state output from the Hall element, and outputting the amplified voltages;

an offset detection unit receiving the output voltage in the first detection state and the output voltage in the second detection state output from the amplifying unit, detecting an offset, and outputting the detected offset;

a comparison unit determining whether or not the offset output from the offset detection unit is greater than a pre-set positive reference value or smaller than a pre-set negative reference value, and outputting a determination result;

a counter unit increasing a first count value by 1 at a time when the offset is greater than the pre-set positive reference value and increasing a second count value by 1 at a time when the offset is smaller than the pre-set negative reference value based on the determination result output from the comparison unit; and a current supply unit providing a current proportional to the first count value from the counter unit to the amplifying unit to reduce an output voltage, and allowing a current proportional to the second count value from the counter unit to flow from the amplifying unit to increase the output voltage.

2. The offset compensation apparatus as set forth in claim 1, wherein the offset detection unit includes:
a first switch connected to an output terminal of the amplifying unit;
a first capacitor positioned between the first switch and a ground;
a second switch positioned between the first capacitor and the comparison unit;
a third switch connected to the output terminal of the amplifying unit;
a second capacitor positioned between the third switch and a ground; and
a fourth switch positioned between the second capacitor and the comparison unit,
wherein, in the first detection state, the first switch is turned on and the second and third switches are turned off to store a first detection state value as an accumulated quantity of electric charges in the first capacitor, and in the second detection state, the first and fourth switches are turned off and the second switch is turned on to store a second detection state value as an accumulated quantity of electric charges in the second capacitor, and then, the accumulated quantity of electric charges of the first capacitor and that of the second capacitor are averaged to detect an offset.

3. The offset compensation apparatus as set forth in claim 1, wherein the comparison unit includes:
a first comparator determining whether or not the offset output from the offset detection unit is greater than the pre-set positive reference value; and
a second comparator determining whether or not the offset output from the offset detection unit is smaller than the pre-set negative reference value.

4. The offset compensation apparatus as set forth in claim 1, wherein the counter unit includes:
a first counter increasing the first count value by 1 at a time when the offset is greater than the pre-set positive reference value according to the determination result output from the comparison unit; and
a second counter increasing the second count value by 1 at a time when the offset is smaller than the pre-set negative reference value according to the determination result output from the comparison unit.

5. The offset compensation apparatus as set forth in claim 1, wherein the current supply unit includes:
a first digital-to-analog converter (DAC) providing a current proportional to the first count value to the amplifying unit so that an output value obtained by subtracting the provided current value in proportion thereto is output; and a second DAC allowing a current proportional to the second count value to flow from the amplifying unit so that a value obtained by adding the outflow current value in proportion thereto is output.

6. The offset compensation apparatus as set forth in claim 1, further comprising:
a sample hold circuit unit sampling and holding the output voltage in the first detection state and the output voltage in the second detection state output from the amplifying unit;
an adding unit receiving the output voltage in the first detection state and the output voltage in the second detection state which have been sampled and held by the sample hold circuit unit, and outputting a Hall voltage from which an offset voltage was canceled; and
a Schmitt trigger comparing an output voltage output from an output terminal of the adding unit with a pre-set voltage value to determine whether or not the former is greater than the latter, and outputting a corresponding determination value.

7. An offset compensation method for a magnetic detection circuit, the method comprising:
receiving, by an offset detection unit, an output voltage in a first detection state and an output voltage in a second detection state output from an amplifying unit, detecting an offset, and outputting the detected offset;
determining, by a comparison unit, whether or not the offset output from the offset detection unit is greater than a pre-set positive reference value or smaller than a pre-set negative reference value;
increasing, by a counter unit, a first count value by 1 at a time when the offset is greater than the pre-set positive reference value and increasing a second count value by 1 at a time when the offset is smaller than the pre-set negative reference value based on the determination result output from the comparison unit; and
providing, by a current supply unit, a current proportional to the first count value from the counter unit to the amplifying unit to reduce an output voltage, and allowing a current proportional to the second count value from the counter unit to flow from the amplifying unit to increase the output voltage.

8. The method as set forth in claim 7, wherein receiving includes:
storing the first detection state value as an accumulated quantity of electric charges in a first capacitor provided in the offset detection unit in the first detection state;
storing the second detection state value as an accumulated quantity of electric charges in a second capacitor provided in the offset detection unit; and
averaging the accumulated quantity of electric charges of the first capacitor and that of the second capacitor to detect an offset.

9. The method as set forth in claim 7, wherein determining includes:
determining, by a first comparator provided in the comparison unit, whether or not the offset output from the offset detection unit is greater than the pre-set positive reference value; and
determining, by a second comparator provided in the comparison unit, whether or not the offset output from the offset detection unit is smaller than the pre-set negative reference value.

10. The method as set forth in claim 7, wherein increasing, by a counter unit, includes:
increasing, by a first counter provided in the counter unit, the first count value by 1 at a time when the offset is greater than the pre-set positive reference value according to the determination result output from the comparison unit; and increasing, by a second counter provided in the counter unit, the second count value by 1 at a time when the offset is smaller than the pre-set negative reference value according to the determination result output from the comparison unit.

11. The method as set forth in claim 7, wherein providing includes:

provided, by a first digital-to-analog converter (DAC) provided in the current supply unit, a current proportional to the first count value to an amplifying unit so that an output value obtained by subtracting the provided current value in proportion thereto is output; and allowing, by a second DAC provided in the current supply unit, a current proportional to the second count value to flow from the amplifying unit so that a value obtained by adding the outflow current value in proportion thereto is output.

* * * * *